United States Patent
Lee

(10) Patent No.: US 10,923,201 B2
(45) Date of Patent: Feb. 16, 2021

(54) MEMORY DEVICE AND METHOD OF OPERATING THE MEMORY DEVICE

(71) Applicant: SK hynix Inc., Icheon-si (KR)

(72) Inventor: Un Sang Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/592,338

(22) Filed: Oct. 3, 2019

(65) Prior Publication Data
US 2020/0294606 A1 Sep. 17, 2020

(30) Foreign Application Priority Data
Mar. 11, 2019 (KR) .......................... 10-2019-0027736

(51) Int. Cl.
  *G11C 16/34* (2006.01)
  *G11C 16/14* (2006.01)
  *G11C 16/04* (2006.01)
(52) U.S. Cl.
  CPC ...... *G11C 16/3409* (2013.01); *G11C 16/0483* (2013.01); *G11C 16/14* (2013.01); *G11C 16/3445* (2013.01)
(58) Field of Classification Search
  CPC .......................... G11C 16/3409; G11C 16/14
  USPC ........................................ 365/185.24, 185.3
  See application file for complete search history.

(56) References Cited

U.S. PATENT DOCUMENTS

| | | | | |
|---|---|---|---|---|
| 7,630,251 B2* | 12/2009 | Hosono | ............ | G11C 16/3418 365/185.09 |
| 7,869,280 B2* | 1/2011 | Kosaki | ............ | G11C 16/3454 365/185.2 |
| 7,894,268 B2* | 2/2011 | Hosono | ............ | G11C 16/3404 365/185.2 |
| 7,957,199 B2* | 6/2011 | Kim | ............ | G11C 16/14 365/185.22 |
| 7,974,130 B2* | 7/2011 | Nakamura | ............ | G11C 16/344 365/185.2 |
| 8,644,082 B2* | 2/2014 | Baek | ............ | G11C 16/14 365/185.3 |
| 9,721,664 B2* | 8/2017 | Nam | ............ | G11C 16/0483 |
| 9,805,798 B2* | 10/2017 | Shiino | ............ | G11C 16/10 |
| 9,997,248 B2* | 6/2018 | Lee | ............ | G11C 16/344 |

FOREIGN PATENT DOCUMENTS

KR 1020160058521 A 5/2016
KR 101642930 B1 7/2016

* cited by examiner

*Primary Examiner* — Son L Mai
(74) *Attorney, Agent, or Firm* — William Park & Associates Ltd.

(57) ABSTRACT

Provided herein may be a memory device and a method of operating the memory device. The memory device may include: a memory block including a plurality of normal memory cells and a plurality of dummy memory cells; a peripheral circuit configured to perform an erase operation and a soft program operation on the memory block; and control logic configured to control the peripheral circuit to control the erase operation and the soft program operation, wherein during the soft program operation, threshold voltages of first dummy memory cells of the plurality of dummy memory cells are controlled to be higher than threshold voltages of second dummy memory cells of the plurality of dummy memory cells.

20 Claims, 9 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2019-0027736, filed on Mar. 11, 2019, in the Korean Intellectual Property Office, the entire disclosure of which is incorporated herein by reference.

BACKGROUND

1. Technical Field

Various embodiments of the present disclosure relate to an electronic device, and more particularly, to a memory device and a method of operating the memory device.

2. Related Art

Recently, the paradigm for the computer environment has been converted into ubiquitous computing so that computer systems can be used anytime and anywhere. Thereby, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device of the portable electronic devices.

A data storage device using a memory device provides advantages in that, since there is no mechanical driving part, stability and durability are excellent, an information access speed is increased, and power consumption is reduced. Data storage devices, as an example of the memory system having such advantages, may include a universal serial bus (USB) memory device, a memory card having various interfaces, a solid state drive (SSD), and so forth.

Memory devices are classified into volatile memory devices and nonvolatile memory devices.

A nonvolatile memory device, although having comparatively low read and write speeds, may retain data stored therein even when power supply is interrupted. Therefore, the nonvolatile memory device is used when there is the need for storing data which is required to be retained regardless of whether or not it is connected to a power supply. Representative examples of the nonvolatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory is classified into a NOR type memory and a NAND type memory.

SUMMARY

An embodiment of the present disclosure may provide for a memory device including: a memory block including a plurality of normal memory cells and a plurality of dummy memory cells; a peripheral circuit configured to perform an erase operation and a soft program operation on the memory block; and control logic configured to control the peripheral circuit to control the erase operation and the soft program operation, wherein during the soft program operation, threshold voltages of first dummy memory cells of the plurality of dummy memory cells are controlled to be higher than threshold voltages of second dummy memory cells of the plurality of dummy memory cells.

An embodiment of the present disclosure may provide for a method of operating a memory device, including: performing an erase operation on a memory block; performing a soft program operation on a plurality of dummy memory cells included in the memory block; and applying, after the soft program operation is completed, an additional program voltage to first dummy memory cells of the dummy memory cells at least once.

An embodiment of the present disclosure may provide for a method of operating a memory device, including: performing an erase operation on a memory block including a plurality of normal memory cells and a plurality of dummy memory cells; performing a first soft program operation on the plurality of dummy memory cells; and performing a second soft program operation on first dummy memory cells of the plurality of dummy memory cells.

DETAILED DESCRIPTION

Figure 1:
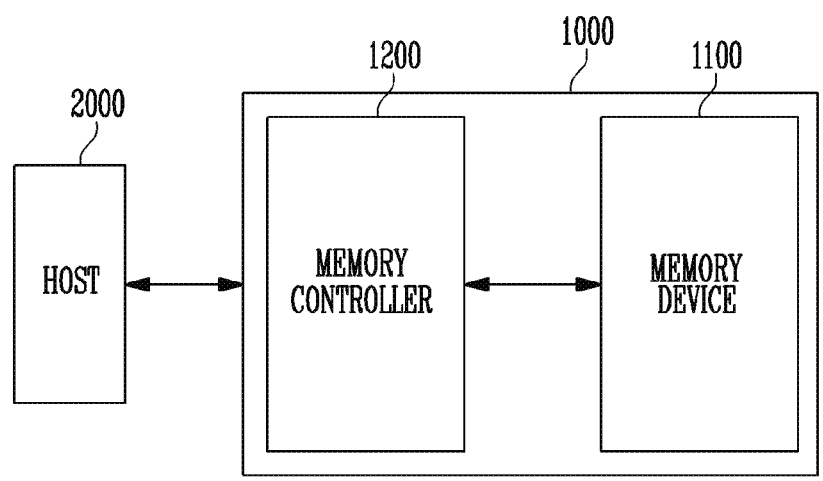
FIG. 1 is a diagram illustrating a memory system in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described based on embodiments. The present disclosure may, however, be embodied in many different forms and should not be construed as being limited to only the embodiments set forth herein, but should be construed as covering modifications, equivalents or alternatives falling within ideas and technical scopes of the present disclosure. However, it is to be understood that the present description is not intended to limit the present disclosure to those examples of embodiments, and the present disclosure is intended to cover not only the examples of embodiments, but also various alternatives, modifications, equivalents and other embodiments that fall within the spirit and scope of the present disclosure.

It will be understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described hereinafter with reference to the accompanying drawings, in which preferred embodiments of the present disclosure are shown, so that those of ordinary skill in the art can easily carry out the technical idea of the present disclosure.

Various embodiments of the present disclosure may be directed to a memory device capable of adjusting a threshold voltage distribution of dummy memory cells during an erase operation of the memory device, and a method of operating the memory device.

FIG. 1 is a diagram illustrating a memory system 1000 in accordance with an embodiment of the present disclosure.

Referring to FIG. 1, the memory system 1000 may include a memory device 1100 configured to store data, and a memory controller 1200 configured to control the memory device 1100 under control of a host 2000.

The host 2000 may communicate with the memory system 1000 using an interface protocol such as a peripheral component interconnect-express (PCI-E) protocol, an advanced technology attachment (ATA) protocol, a serial ATA (SATA) protocol, a parallel ATA (PATA) protocol, or a serial attached SCSI (SAS) protocol. In addition, the interface protocol provided for the purpose of data communication between the host 2000 and the memory system 1000 is not limited to the foregoing examples, and it may be any one of interface protocols such as a universal serial bus (USB) protocol, a multi-media card (MMC) protocol, an enhanced small disk interface (ESDI) protocol, and an integrated drive electronics (IDE) protocol.

The memory controller 1200 may control the overall operation of the memory system 1000 and data exchange between the host 2000 and the memory device 1100. For instance, the memory controller 1200 may control the memory device 1100 to program or read data in response to a request of the host 2000. Furthermore, the memory controller 1200 may control the memory device 1100 and erase the data in response to a request of the host 2000. In an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), or a flash memory.

The memory device 1100 may perform a program operation, a read operation, or an erase operation under control of the memory controller 1200.

Furthermore, the memory device 1100 may include a plurality of normal memory cells and a plurality of dummy memory cells, and perform a soft program operation on the dummy memory cells during an erase operation. During a soft program operation on the dummy memory cells, the memory device 1100 may program the dummy memory cells such that threshold voltages of some of the dummy memory cells are higher than that of the other dummy memory cells.

Figure 2:
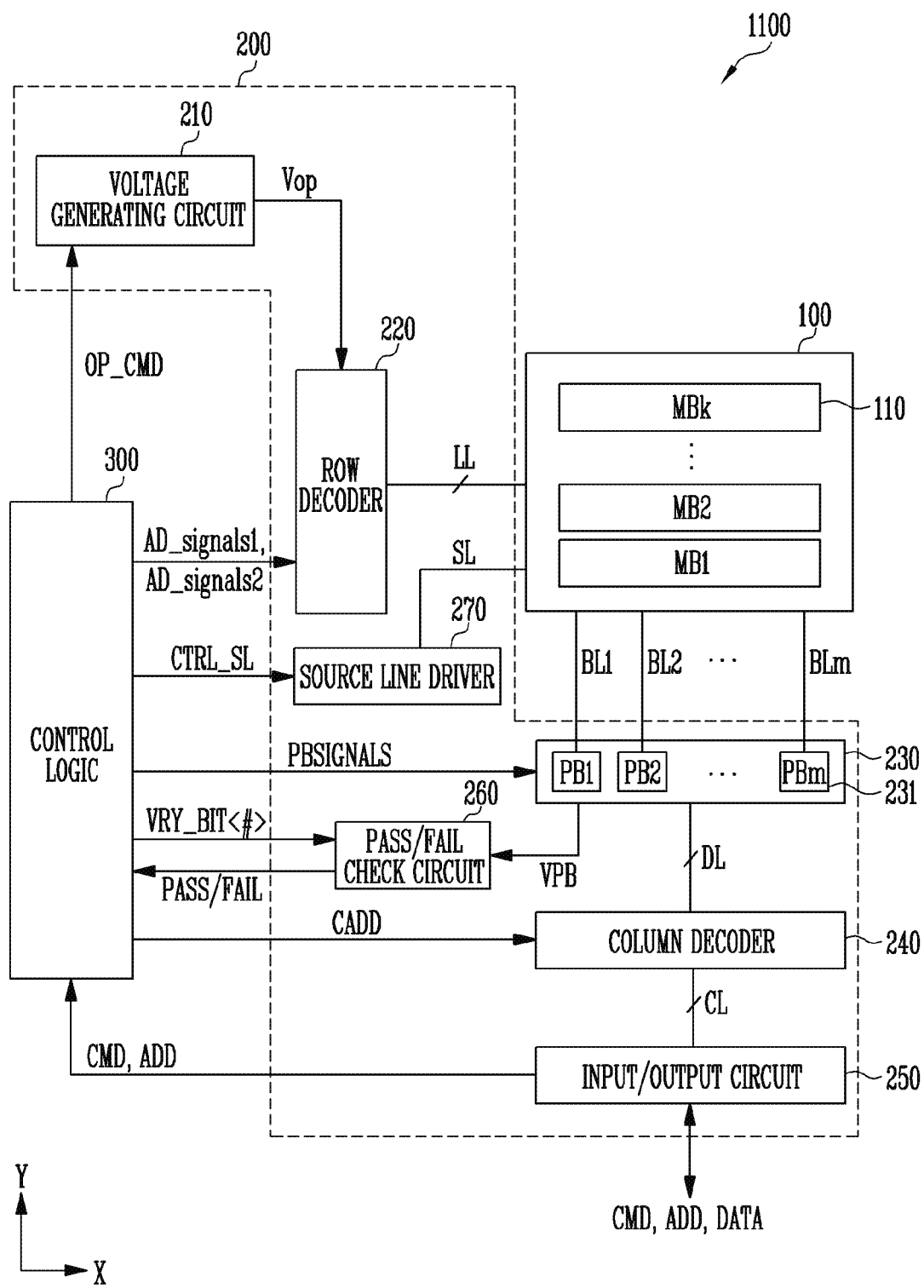
FIG. 2 is a diagram illustrating a memory device of FIG. 1.

FIG. 2 is a diagram illustrating a memory device 1100 of FIG. 1.

Referring to FIG. 2, the memory device 1100 may include a memory cell array 100 configured to store data. The memory device 1100 may include peripheral circuits 200 configured to perform a program operation for storing data in the memory cell array 100, a read operation for outputting the stored data, and an erase operation for erasing the stored data. The memory device 1100 may include control logic 300 configured to control the peripheral circuits 200 under control of the memory controller (1200 of FIG. 1). The control logic 300 may be implemented as hardware, software, or a combination of hardware and software. For example, the control logic 130 may be a control logic circuit operating in accordance with an algorithm and/or a processor executing control logic code.

The memory cell array 100 may include a plurality of memory blocks MB1 to MBk (110; k is a positive integer). Local lines LL and bit lines BL1 to BLm (m is a positive integer) may be coupled to each of the memory blocks MB1 to MBk (110). For example, the local lines LL may include a first select line, a second select line, and a plurality of word lines arranged between the first and the second select lines. The local lines LL may include dummy lines arranged between the first select line and the word lines and between the second select line and the word lines. Here, the first select line may be a source select line, and the second select line may be a drain select line. The first select line may include two or more source select lines. For example, the local lines LL may include word lines, drain and source select lines, and source lines SL. For example, the local lines LL may further include dummy lines. The local lines LL may be coupled to each of the memory blocks MB1 to MBk (110). The bit lines BL1 to BLm may be coupled in common to the memory blocks MB1 to MBk (110). The memory blocks MB1 to MBk (110) may be embodied in a two- or three-dimensional structure. For example, in the memory blocks 110 having a two-dimensional structure, the memory cells may be arranged in a direction parallel to a substrate. For instance, in the memory blocks 110 having a three-dimensional structure, the memory cells may be stacked in a direction perpendicular to the substrate.

The peripheral circuits 200 may perform a program operation, a read operation, or an erase operation on a selected memory block 110 under control of the control logic 300. For instance, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop to be used for a program operation, a read operation, and an erase operation in response to an operating signal OP_CMD. Furthermore, the voltage generating circuit 210 may selectively discharge the local lines LL in response to an operating signal OP_CMD. For example, the voltage generating circuit 210 may generate a soft program voltage, an erase verify voltage, first and second soft program verify voltages, a pass voltage, a turn-on voltage, a turn-off voltage, etc. under control of the control logic 300.

The row decoder 220 may transmit operating voltages Vop to local lines LL coupled to a selected memory block 110 in response to row decoder control signals AD_signals1 and AD_signals2. For example, the row decoder 220 may selectively apply operating voltages (e.g., a soft program voltage, an erase verify voltage, first and second soft program verify voltages, and a pass voltage) generated by the voltage generating circuit 210 to the word lines of the local lines LL in response to the row decoder control signals AD_signals1, or may selectively apply operating voltages (e.g., a turn-on voltage and a turn-off voltage) generated by the voltage generating circuit 210 to the source select line and the drain select line of the local lines LL in response to the row decoder control signals AD_signals2.

The page buffer group 230 may include a plurality of page buffers PB1 to PBm (231) coupled to the bit lines BL1 to BLm. The page buffers PB1 to PBm (231) may operate in response to page buffer control signals PBSIGNALS. For instance, the page buffers PB1 to PBm (231) may temporarily store data received through the bit lines BL1 to BLm or sense voltages or currents of the bit lines BL1 to BLm during a read or verify operation.

The column decoder 240 may transmit data between the input/output circuit 250 and the page buffer group 230 in response to a column address CADD. For example, the column decoder 240 may exchange data with the page buffers 231 through data lines DL or exchange data with the input/output circuit 250 through column lines CL.

The input/output circuit 250 may transmit a command CMD or an address ADD received from the memory controller (1200 of FIG. 1) to the control logic 300, or exchange data with the column decoder 240.

During a read operation or a verify operation, the pass/fail check circuit 260 may generate a reference current in response to an enable bit VRY_BIT<#>, and may compare a sensing voltage VPB received from the page buffer group 230 with a reference voltage generated by the reference current and output a pass signal PASS or a fail signal FAIL.

The source line driver 270 may be coupled, through the source line SL, to the memory cells included in the memory cell array 100, and may control a voltage to be applied to the source line SL. For example, the source line driver 270 may provide an erase voltage to the source line SL during an erase operation in response to a control signal CTRL SL received from the control logic 300. The erase voltage may be a voltage which gradually increases by a step voltage as the number of times erase voltages have been applied is increased.

The control logic 300 may control the peripheral circuits 200 by outputting an operating signal OP_CMD, row decoder control signals AD_signals1 and AD_signals2, page buffer control signals PBSIGNALS, and an enable bit VRY_BIT<#> in response to a command CMD and an address ADD. In addition, the control logic 300 may determine whether a target memory cell has passed a verification during a verify operation in response to a pass signal PASS or a fail signal FAIL.

In an embodiment of the present disclosure, the control logic 300 may control the peripheral circuits 200 such that, after an erase operation is performed on normal memory cells and dummy memory cells included in a selected memory block (e.g., MB1) of the memory device 1100, a soft program operation is performed on the dummy memory cells. Furthermore, the control logic 300 may control the peripheral circuits 200 such that, during the soft program operation, threshold voltages of some of the dummy memory cells are higher than that of the other dummy memory cells. The foregoing other dummy memory cells may be dummy memory cells which may be used along with the normal memory cells to perform a program operation and store data when the data storage capacity of the memory device 1100 is insufficient.

Figure 3:
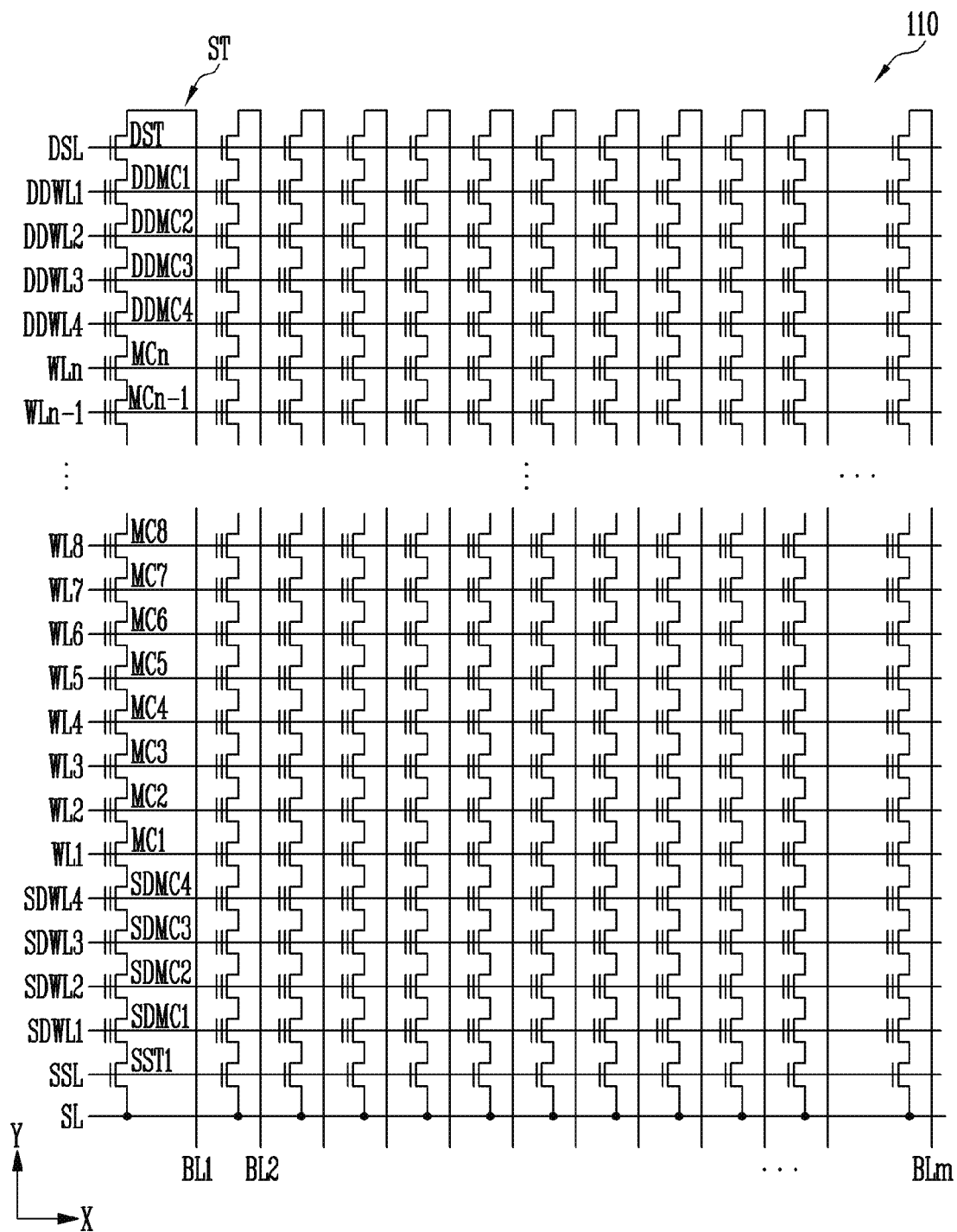
FIG. 3 is a diagram illustrating a memory block of FIG. 2.

FIG. 3 is a diagram illustrating the memory block 110 of FIG. 2.

Referring to FIG. 3, in the memory block 110, a plurality of word lines WL1 to WLn arranged parallel to each other may be coupled between a first select line SSL and a second select line DSL. Here, the first select line SSL may be a source select line, and the second select line DSL may be a drain select line. Although the drawing illustrates one first select line SSL and one second select line DSL, the present disclosure is not limited thereto. For example, at least two or more first select lines and at least two or more second select lines may be disposed.

The memory block 110 may include a plurality of source dummy word lines SDWL1 to SDWL4 between the first select line SSL and the outermost word line WL1, and a plurality of drain dummy word lines DDWL1 to DDWL4 between the second select line DSL and the outermost word line WLn. Although the drawing illustrates four source dummy word lines SDWL1 to SDWL4 and four drain dummy word lines DDWL1 to DDWL4, the present disclosure is not limited thereto. For example, at least two or more source dummy word lines and at least two or more drain dummy word lines may be disposed.

The memory block 110 may include a plurality of strings ST coupled between the bit lines BL1 to BLm and the source line SL. The bit lines BL1 to BLm may be respectively coupled to the strings ST, and the source line SL may be coupled in common to the strings ST. The strings ST may have the same configuration; therefore, the string ST that is coupled to the first bit line BL1 will be described below by way of example.

The string ST may include a source select transistor SST, a plurality of source dummy memory cells SDMC1 to SDMC4, a plurality of memory cells MC0 to MCn, a plurality of drain dummy memory cells DDMC1 to DDMC4, and a drain select transistor DST, which are coupled in series between the source line SL and the first bit line BL1. The plurality of memory cells MC0 to MCn may be defined as normal memory cells. The plurality of source dummy memory cells SDMC1 to SDMC4 and the plurality of drain dummy memory cells DDMC1 to DDMC4 may be defined as dummy memory cells.

A source of the source select transistor SST may be coupled to the source line SL, and a drain of the drain select transistor DST may be coupled to the first bit line BL1. The plurality of source dummy memory cells SDMC1 to SDMC4 may be coupled in series between the source select transistor SST and the outermost memory cell MC1. The plurality of drain dummy memory cells DDMC1 to DDMC4 may be coupled in series between the drain select transistor DST and the outermost memory cell MCn. The memory cells MC1 to MCn may be coupled between the source dummy memory cell SDMC1 and the drain dummy memory cell DDMC1.

Gates of the source select transistors SST included in the plurality of strings ST may be coupled to the source select line SSL. Gates of the drain select transistors DST may be coupled to the drain select line DSL. Gates of the plurality of source dummy memory cells SDMC1 to SDMC4 may be coupled to the plurality of source dummy word lines SDWL1 to SDWL4. Gates of the plurality of drain dummy memory cells DDMC1 to DDMC4 may be coupled to the plurality of drain dummy word lines DDWL1 to DDWL4. Gates of the plurality of memory cells MC0 to MCn may be coupled to the plurality of word lines WL1 to WLn.

At least one source dummy memory cell (e.g., SDMC1) disposed adjacent to the source select transistor SST among the plurality of source dummy memory cells SDMC1 to SDMC4, and at least one drain dummy memory cell (e.g., DDMC1) disposed adjacent to the drain select transistor DST among the plurality of drain dummy memory cells DDMC1 to DDMC4 may be defined as first dummy memory cells. The other source dummy memory cells (e.g., SDMC2 to SDMC4 and DDMC2 to DDMC4) may be defined as second dummy memory cells. The second dummy memory cells may be dummy memory cells which may be used along with the normal memory cells to perform a program operation and store data when the data storage capacity of the memory device is insufficient.

Figure 4:
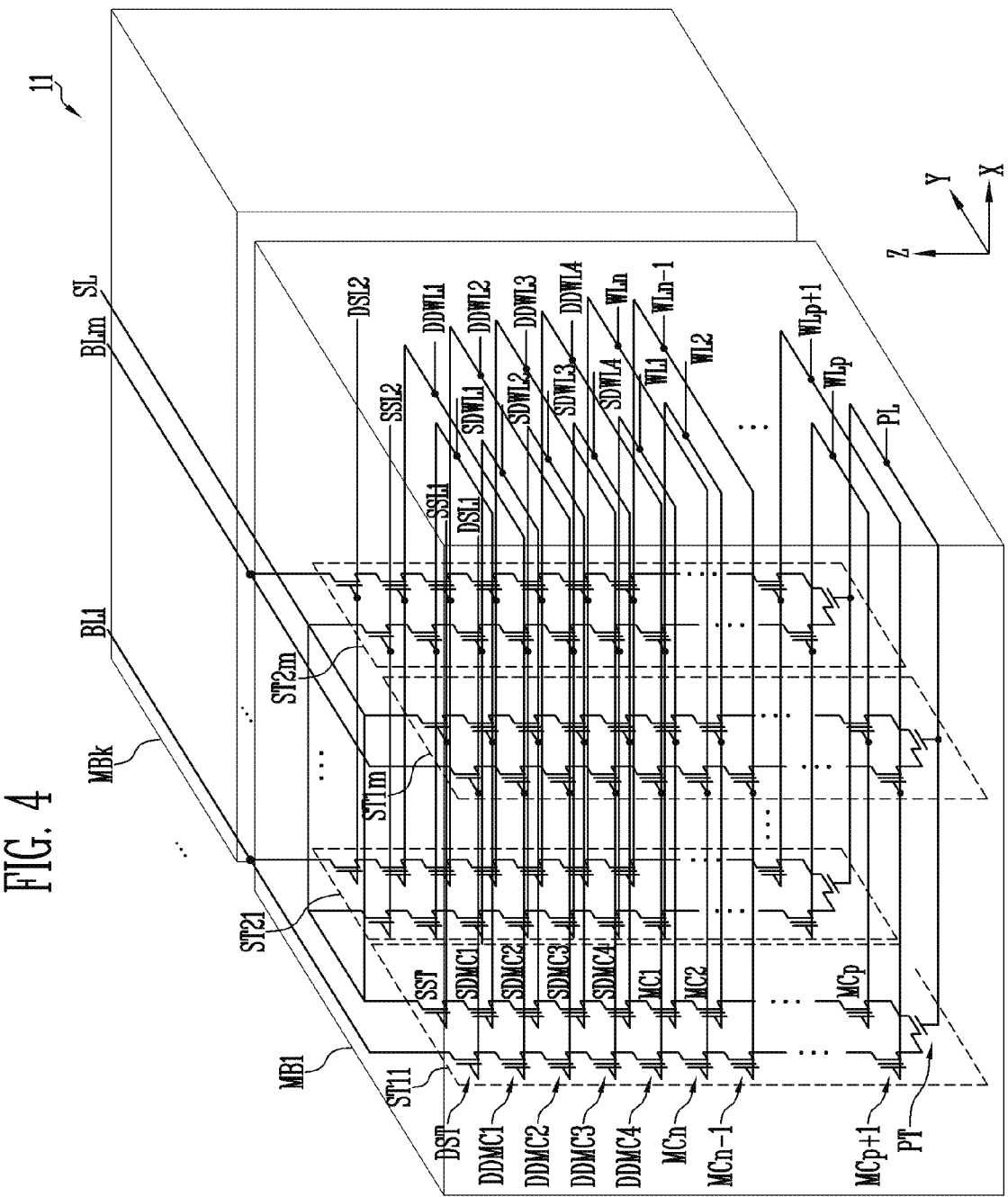
FIG. 4 is a diagram illustrating a memory block having a three-dimensional structure in accordance with an embodiment of the present disclosure.

FIG. 4 is a diagram illustrating a memory block 110 having a three-dimensional structure in accordance with an embodiment of the present disclosure.

Referring to FIG. 4, each memory block 110 may include a plurality of strings ST11 to ST1m and ST21 to ST2m. In an embodiment, each of the strings ST11 to ST1m and ST21 to ST2m may be formed in a 'U' shape. In the first memory block MB1, m strings may be arranged in a row direction (i.e. an X direction). FIG. 4 illustrates that two strings are arranged in a column direction (i.e., a Y direction), but this is only for the sake of explanation. For example, three or more strings may be arranged in the column direction (the Y direction).

Each of the plurality of strings ST11 to ST1m and ST21 to ST2m may include at least one source select transistor SST, a plurality of source dummy memory cells SDMC1 to SDMC4, first to n-th memory cells MC1 to MCn, a pipe transistor PT, a plurality of drain dummy memory cells DDMC1 to DDMC4, and at least one drain select transistor DST.

The plurality of source dummy memory cells SDMC1 to SDMC4, the plurality of drain dummy memory cells DDMC1 to DDMC4, and the plurality of memory cells MC1 to MCn may have similar structures. For example, the plurality of source dummy memory cells SDMC1 to SDMC4, the plurality of drain dummy memory cells DDMC1 to DDMC4, and the plurality of memory cells MC1 to MCn each may include a channel layer, a tunnel insulating layer, a charge trap layer, and a blocking insulating layer. For example, a pillar for providing the channel layer may be provided in each string. For instance, a pillar for providing at least one of the channel layer, the tunnel insulating layer, the charge trap layer, and the blocking insulating layer may be provided in each string.

The source select transistor SST of each string may be coupled between the source line SL and the source dummy memory cell SDMC1. The plurality of source dummy memory cells SDMC1 to SDMC4 may be coupled between the source select transistor SST and the memory cell MC1.

In an embodiment, source select transistors of strings arranged in the same row may be coupled to a source select line extending in the row direction. Source select transistors of strings arranged in different rows may be coupled to different source select lines. In FIG. 4, source select transistors of the strings ST11 to ST1m in a first row may be coupled to a first source select line SSL1. Source select transistors of the strings ST21 to ST2m in a second row may be coupled to a second source select line SSL2.

In an embodiment, the source select transistors of the strings ST11 to ST1m and ST21 to ST2m may be coupled in common to a single source select line.

The plurality of source dummy memory cells SDMC1 to SDMC4 may be coupled to the plurality of source dummy word lines SDWL1 to SDWL4.

The first to n-th memory cells MC1 to MCn in each string may be coupled between the source dummy memory cell SDMC4 and the drain dummy memory cell DDMC4.

The first to n-th memory cells MC1 to MCn may be divided into first to p-th memory cells MC1 to MCp and p+1-th to n-th memory cells MCp+1 to MCn. The first to p-th memory cells MC1 to MCp may be successively arranged in a vertical direction (i.e., in a Z direction) and coupled in series to each other between the source dummy memory cell SDMC4 and the pipe transistor PT. The p+1-th to n-th memory cells MCCp+1 to MCn may be successively arranged in the vertical direction (the Z direction) and coupled in series to each other between the pipe transistor PT and the drain dummy memory cell DDMC4. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be respectively coupled to first to n-th word lines WL1 to WLn.

The drain select transistor DST of each string may be coupled between the corresponding bit line and the drain dummy memory cell DMC1. The plurality of drain dummy memory cells DDMC1 to DDMC4 may be coupled between the drain select transistor DST and the memory cell MCn.

Strings arranged in the row direction may be coupled to corresponding drain select lines extending in the row direction. The drain select transistors of the strings ST11 to ST1m in the first row may be coupled to a first drain select line DSL1. The drain select transistors of the strings ST21 to ST2m in the second row may be coupled to a second drain select line DSL2.

Strings arranged in the column direction may be coupled to corresponding bit lines extending in the column direction. In FIG. 4, the strings ST11 and ST21 in a first column may be coupled to a first bit line BL1. The strings ST1m and ST2m in an m-th column may be coupled to an m-th bit line BLm.

The plurality of drain dummy memory cells DDMC1 to DDMC4 may be coupled to the plurality of drain dummy word lines DDWL1 to DDWL4.

Among the strings arranged in the row direction, memory cells coupled to the same word line may form one page. For example, memory cells coupled to the first word line WL1 in the strings ST11 to ST1m of the first row may form a single page. Memory cells coupled to the first word line WL1 in the strings ST21 to ST2m of the second row may form another single page. When any one of the drain select lines DSL1 and DSL2 is selected, strings arranged in the corresponding row may be selected. When any one of the word lines WL1 to WLn is selected, a corresponding single page may be selected from the selected strings.

Figure 5:
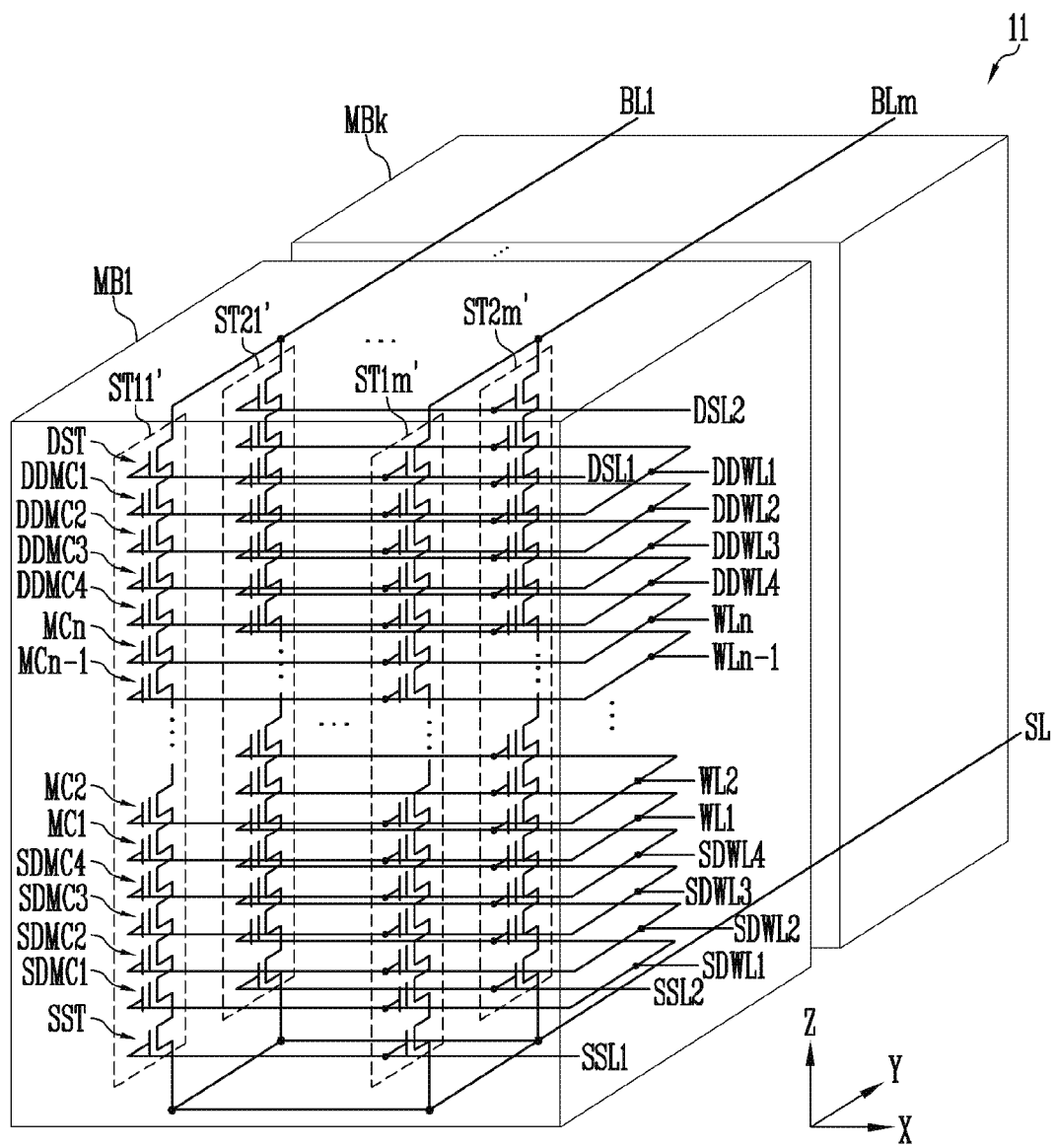
FIG. 5 is a diagram illustrating a memory block having a three-dimensional structure in accordance with an embodiment of the present disclosure.

FIG. 5 is a diagram illustrating a memory block 110 having a three-dimensional structure in accordance with an embodiment of the present disclosure.

Referring to FIG. 5, each memory block 110 may include a plurality of strings ST11' to ST1m' and ST21' to ST2m'. Each of the strings ST11' to ST1m' and ST21' to ST2m' may extend in a vertical direction (i.e., in a Z direction). In each memory block 110, m strings may be arranged in a row direction (i.e., in an X direction). FIG. 5 illustrates that two strings are arranged in a column direction (i.e., in a Y direction), but this is only for the sake of explanation. For example, three or more strings may be arranged in the column direction (the Y direction).

Each of the plurality of strings ST11' to ST1m' and ST21' to ST2m' may include at least one source select transistor SST, a plurality of source dummy memory cells SDMC1 to SDMC4, first to n-th memory cells MC1 to MCn, a plurality of drain dummy memory cells DDMC1 to DDMC4, and at least one drain select transistor DST.

The plurality of source dummy memory cells SDMC1 to SDMC4, the plurality of drain dummy memory cells DDMC1 to DDMC4, and the plurality of memory cells MC1 to MCn may have similar structures. For example, the plurality of source dummy memory cells SDMC1 to SDMC4, the plurality of drain dummy memory cells DDMC1 to DDMC4, and the plurality of memory cells MC1 to MCn each may include a channel layer, a tunnel insulating layer, a charge trap layer, and a blocking insulating layer. For example, a pillar for providing the channel layer may be provided in each string. For instance, a pillar for providing at least one of the channel layer, the tunnel insulating layer, the charge trap layer, and the blocking insulating layer may be provided in each string.

The source select transistor SST of each string may be coupled between the source line SL and the source dummy memory cell SDMC1. The plurality of source dummy memory cells SDMC1 to SDMC4 may be coupled between the source select transistor SST and the memory cell MC1.

Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The plurality of source dummy memory cells SDMC1 to SDMC4 may be coupled to the plurality of source dummy word lines SDWL1 to SDWL4.

The first to n-th memory cells MC1 to MCn in each string may be coupled in series between the source dummy memory cell SDMC4 and the drain dummy memory cell DDMC4. Gates of the first to n-th memory cells MC1 to MCn may be respectively coupled to first to n-th word lines WL1 to WLn.

The drain select transistor DST of each string may be coupled between the corresponding bit line and the drain dummy memory cell DMC1. The plurality of drain dummy memory cells DDMC1 to DDMC4 may be coupled between the drain select transistor DST and the memory cell MCn.

Drain select transistors DST of strings arranged in the row direction may be coupled to corresponding drain select lines extending in the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

The plurality of drain dummy memory cells DDMC1 to DDMC4 may be coupled to the plurality of drain dummy word lines DDWL1 to DDWL4.

Figure 6:
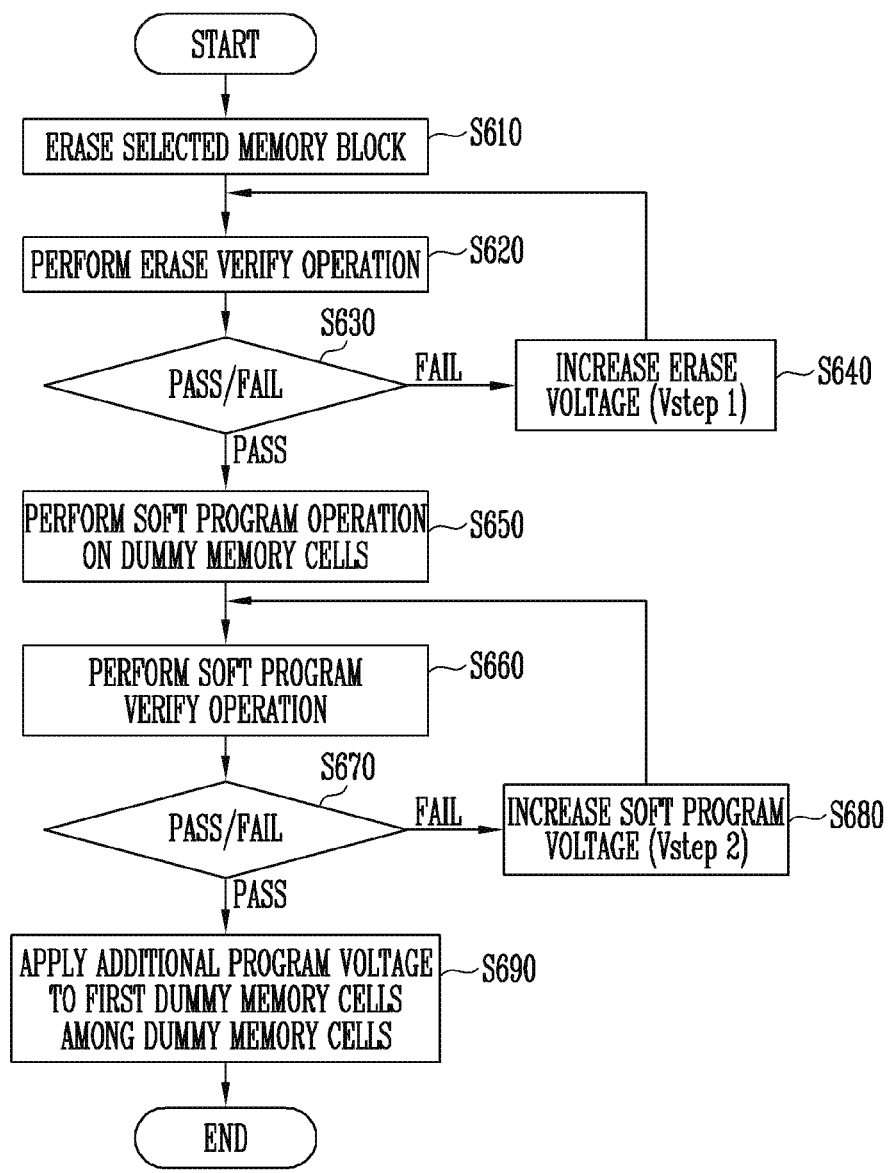
FIG. 6 is a flowchart for explaining an operation of the memory device in accordance with an embodiment of the present disclosure.

FIG. 6 is a flowchart for explaining an operation of the memory device in accordance with an embodiment of the present disclosure.

The operation of the memory device in accordance with an embodiment of the present disclosure will be described with reference to FIGS. 1 to 6.

An erase operation is performed on a selected memory block (e.g., MB1) of the plurality of memory blocks 110, at step S610. The erase operation is performed by reducing the threshold voltages of the plurality of memory cells MC1 to MCn, the plurality of source dummy memory cells SDMC1 to SDMC4, and the plurality of drain dummy memory cells DDMC1 to DDMC4 that are included in the selected memory block MB1.

During an erase operation, the source line driver 270 may generate an erase voltage and apply the generated erase voltage to the source line SL of the memory block MB1.

Subsequently, an erase verify operation is performed to sense the threshold voltages of the plurality of memory cells MC1 to MCn, the plurality of source dummy memory cells SDMC1 to SDMC4, and the plurality of drain dummy memory cells DDMC1 to DDMC4, at step S620.

At an erase verify operation determination step S630, if threshold voltages of some of the plurality of memory cells MC1 to MCn, the plurality of source dummy memory cells SDMC1 to SDMC4, and the plurality of drain dummy memory cells DDMC1 to DDMC4 are higher than a first target threshold voltage, it is determined that the erase operation has failed (FAIL), and the erase voltage is reset to a value increased by a first step voltage Vstep 1, at step S640. Thereafter, the process is re-performed from step S620.

At the erase verify operation determination step S630, if the threshold voltages of the plurality of memory cells MC1 to MCn, the plurality of source dummy memory cells SDMC1 to SDMC4, and the plurality of drain dummy memory cells DDMC1 to DDMC4 are lower than the first target threshold voltage, it is determined that the erase operation has passed (PASS).

If it is determined that the erase operation has passed, a soft program operation is performed on the dummy memory cells, at step S650.

In an embodiment, during the soft program operation, the threshold voltages of the plurality of source dummy memory cells SDMC1 to SDMC4 and the plurality of drain dummy memory cells DDMC1 to DDMC4 may be programmed to levels higher than that of the threshold voltages of the plurality of memory cells MC1 to MCn. The soft program operation may be performed by applying soft program voltages to the source dummy word lines SDWL1 to SDWL4 and the drain dummy word lines DDWL1 to DDWL4 that are coupled to the plurality of source dummy memory cells SDMC1 to SDMC4 and the plurality of drain dummy memory cells DDMC1 to DDMC4.

Subsequently, a soft program verify operation is performed to sense the threshold voltages of the plurality of source dummy memory cells SDMC1 to SDMC4 and the plurality of drain dummy memory cells DDMC1 to DDMC4, at step S660.

At a soft program operation determination step S670, if it is determined that the threshold voltages of the plurality of source dummy memory cells SDMC1 to SDMC4 and the plurality of drain dummy memory cells DDMC1 to DDMC4 are lower than a second target threshold voltage, it is determined that the soft program operation has failed (FAIL), and the soft program voltage is reset to a value increased by a second step voltage Vstep 2, at step S680. Thereafter, the process is re-performed from step S660. In an embodiment, the second target threshold voltage is a voltage lower than 0 V.

At the soft program operation determination step S670, if it is determined that the threshold voltages of some of the plurality of source dummy memory cells SDMC1 to SDMC4 and the plurality of drain dummy memory cells DDMC1 to DDMC4 are equal to or higher than the second target threshold voltage, it is determined that the soft program operation has passed (PASS).

If it is determined that the soft program operation has passed, an additional program voltage is applied to the first dummy memory cells of the dummy memory cells, at step S690.

The first dummy memory cells may be defined both as at least one source dummy memory cell (e.g., SDMC1) adjacent to the source select transistor SST among the plurality of source dummy memory cells SDMC1 to SDMC4 and as at least one drain memory cell (e.g., DDMC1) adjacent to the drain select transistor DST among the plurality of drain dummy memory cells DDMC1 to DDMC4. Furthermore, among the plurality of source dummy memory cells SDMC1 to SDMC4 and the plurality of drain dummy memory cells DDMC1 to DDMC4, the other source dummy memory cells and the other drain dummy memory cells except the first dummy memory cells may be defined as the second dummy memory cells.

The additional program voltage may be a voltage obtained by increasing the last soft program voltage applied during a preceding soft program operation by the second step voltage Vstep 2. In an embodiment, the operation of applying the additional program voltage may include an operation of an additional program voltage to the first dummy memory cells at least once. In an embodiment, if the additional program voltage is applied at least twice, each additional program voltage to be applied may be increased by the second step voltage Vstep 2 compared to an additional program voltage applied during the preceding additional program voltage application operation.

The first dummy memory cells may have threshold voltages higher than that of the second dummy memory cells by the additional program voltage application operation.

The operating time may be improved by skipping a verify operation after the additional program voltage application operation.

As described above, in various embodiments of the present disclosure, after an erase operation and a soft program operation have been performed on a selected memory block, an additional program voltage application operation is performed on first dummy memory cells among the plurality of source dummy memory cells SDMC1 to SDMC4 and the plurality of drain dummy memory cells DDMC1 to DDMC4 so that the threshold voltages of the first dummy memory cells may be increased to values higher than that of the second dummy memory cells.

Due to the first and second dummy memory cells having threshold voltages higher than that of the memory cells, the voltage or current of the strings included in the selected memory block may be reliably controlled. The second dummy memory cells that are lower in threshold voltage than the first dummy memory cells may be used along with the memory cells as memory cells for storing data when the data storage capacity of the memory device is not enough. Consequently, the capacity of the memory device may be improved.

Figure 7:
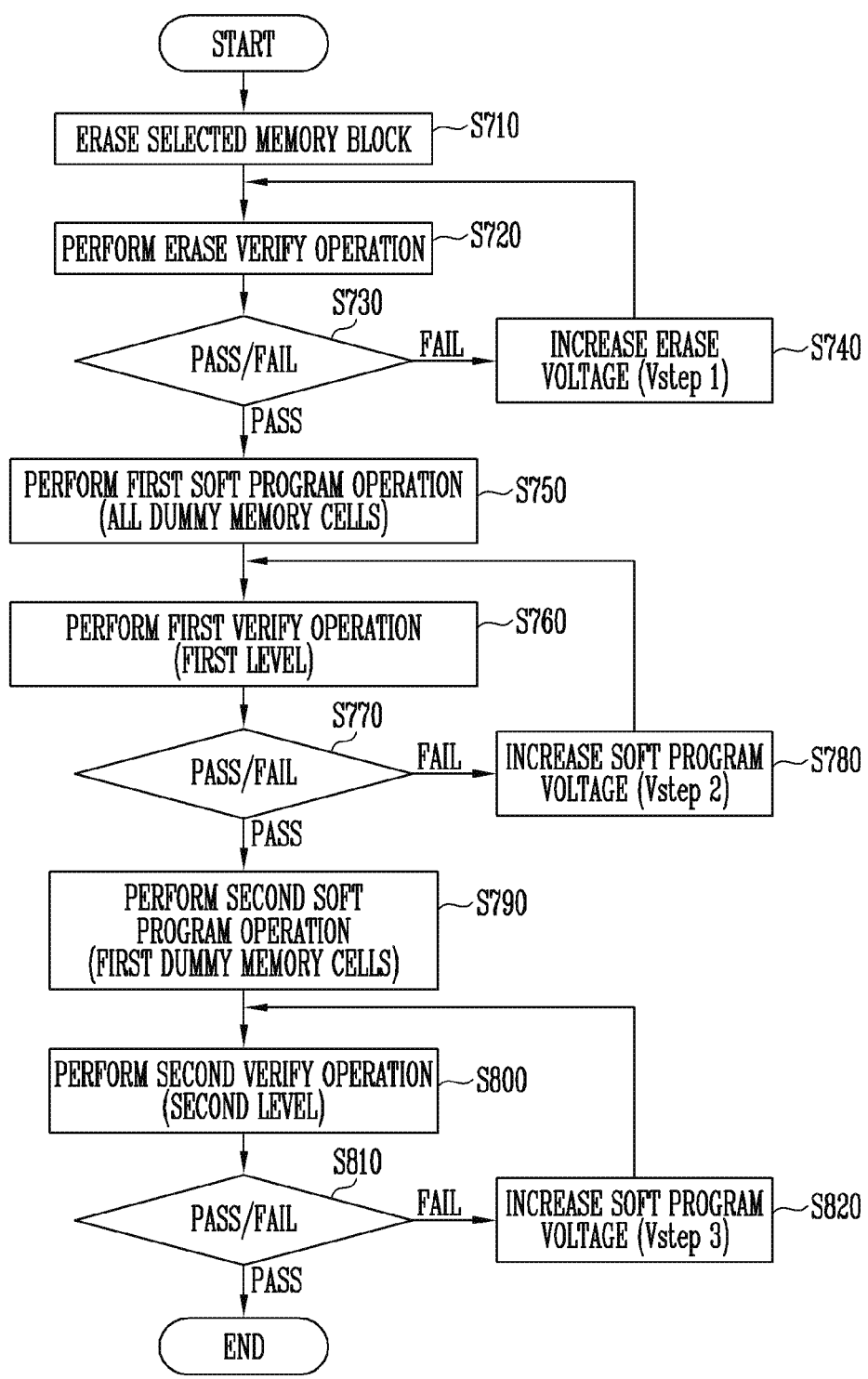
FIG. 7 is a flowchart for explaining an operation of the memory device in accordance with an embodiment of the present disclosure.

FIG. 7 is a flowchart for explaining an operation of the memory device in accordance with an embodiment of the present disclosure.

The operation of the memory device in accordance with an embodiment of the present disclosure will be described with reference to FIGS. 1 to 5 and 7.

An erase operation is performed on a selected memory block (e.g., MB1) of the plurality of memory blocks 110, at step S710. The erase operation is performed by reducing the threshold voltages of the plurality of memory cells MC1 to MCn, the plurality of source dummy memory cells SDMC1 to SDMC4, and the plurality of drain dummy memory cells DDMC1 to DDMC4 that are included in the selected memory block MB1.

During an erase operation, the source line driver 270 may generate an erase voltage and apply the generated erase voltage to the source line SL of the memory block MB1.

Subsequently, an erase verify operation is performed to sense the threshold voltages of the plurality of memory cells MC1 to MCn, the plurality of source dummy memory cells SDMC1 to SDMC4, and the plurality of drain dummy memory cells DDMC1 to DDMC4, at step S720.

At an erase verify operation determination step S730, if threshold voltages of some of the plurality of memory cells MC1 to MCn, the plurality of source dummy memory cells SDMC1 to SDMC4, and the plurality of drain dummy memory cells DDMC1 to DDMC4 are higher than a first target threshold voltage, it is determined that the erase operation has failed (FAIL), and the erase voltage is reset to a value increased by a first step voltage Vstep 1, at step S740. Thereafter, the process is re-performed from step S720.

At the erase verify operation determination step S730, if the threshold voltages of the plurality of memory cells MC1 to MCn, the plurality of source dummy memory cells SDMC1 to SDMC4, and the plurality of drain dummy memory cells DDMC1 to DDMC4 are lower than the first target threshold voltage, it is determined that the erase operation has passed (PASS).

If it is determined that the erase operation has passed, a first soft program operation is performed on the dummy memory cells, at step S750.

In an embodiment, during the first soft program operation, the threshold voltages of the plurality of source dummy memory cells SDMC1 to SDMC4 and the plurality of drain dummy memory cells DDMC1 to DDMC4 may be programmed to levels higher than that of the threshold voltages of the plurality of memory cells MC1 to MCn. The first soft program operation may be performed by applying soft program voltages to the source dummy word lines SDWL1 to SDWL4 and the drain dummy word lines DDWL1 to DDWL4 that are coupled to the plurality of source dummy memory cells SDMC1 to SDMC4 and the plurality of drain dummy memory cells DDMC1 to DDMC4.

Subsequently, a first soft program verify operation is performed to sense the threshold voltages of the plurality of source dummy memory cells SDMC1 to SDMC4 and the plurality of drain dummy memory cells DDMC1 to DDMC4, at step S760.

At a verify operation determination step S770, if it is determined that the threshold voltages of the plurality of source dummy memory cells SDMC1 to SDMC4 and the plurality of drain dummy memory cells DDMC1 to DDMC4 are lower than a second target threshold voltage, it is determined that the first soft program operation has failed (FAIL), and the soft program voltage is reset to a value increased by a second step voltage Vstep 2, at step S780. Thereafter, the process is re-performed from step S760. The second target threshold voltage may correspond to a first level. The first level may be a voltage level lower than 0 V.

At the verify operation determination step S770, if it is determined that the threshold voltages of some of the plurality of source dummy memory cells SDMC1 to SDMC4 and the plurality of drain dummy memory cells DDMC1 to DDMC4 are equal to or higher than the second target threshold voltage, it is determined that the first soft program operation has passed (PASS).

If it is determined that the first soft program operation has passed, a second soft program operation is performed on the first dummy memory cells of the dummy memory cells, at step S790.

The first dummy memory cells may be defined both as at least one source dummy memory cell (e.g., SDMC1) adjacent to the source select transistor SST among the plurality of source dummy memory cells SDMC1 to SDMC4 and as at least one drain memory cell (e.g., DDMC1) adjacent to the drain select transistor DST among the plurality of drain dummy memory cells DDMC1 to DDMC4. Furthermore, among the plurality of source dummy memory cells SDMC1 to SDMC4 and the plurality of drain dummy memory cells DDMC1 to DDMC4, the other source dummy memory cells and the other drain dummy memory cells except the first dummy memory cells may be defined as the second dummy memory cells.

In an embodiment, during the second soft program operation, the first dummy memory cells may be programmed such that the threshold voltages of the first dummy memory cells are higher than the threshold voltages of the second dummy memory cells.

The second soft program operation may be performed using a soft program voltage higher than the last soft program voltage used during the first soft program operation.

Thereafter, a second verify operation is performed to sense the threshold voltages of the first dummy memory cells (e.g., SDMC1 and DDMC1), at step S800.

At a verify operation determination step S810, if it is determined that the threshold voltages of the first dummy memory cells (e.g., SDMC1 and DDMC1) are lower than a third target threshold voltage, it is determined that the second soft program operation has failed (FAIL), and the soft program voltage is reset to a value increased by a third step voltage Vstep 3, at step S820. Thereafter, the process is re-performed from step S800. The third target threshold voltage may correspond to a second level. The second level may be a voltage level higher than the first level.

At the verify operation determination step S810, if the threshold voltages of the first dummy memory cells (e.g., SDMC1 and DDMC1) are equal to or higher than the third target threshold voltage, it is determined that the second soft program operation has passed (PASS).

As described above, in various embodiments of the present disclosure, after an erase operation and a first soft program operation have been performed on a selected memory block, a second soft program operation is performed on first dummy memory cells among the plurality of source dummy memory cells SDMC1 to SDMC4 and the plurality of drain dummy memory cells DDMC1 to DDMC4 so that the threshold voltages of the first dummy memory cells may be increased to values higher than that of the second dummy memory cells.

Due to the first and second dummy memory cells having threshold voltages higher than that of the memory cells, the voltage or current of the strings included in the selected memory block may be reliably controlled. The second dummy memory cells that are lower in threshold voltage than the first dummy memory cells may be used along with the memory cells as memory cells for storing data when the data storage capacity of the memory device is not enough. Consequently, the capacity of the memory device may be improved.

Figure 8:
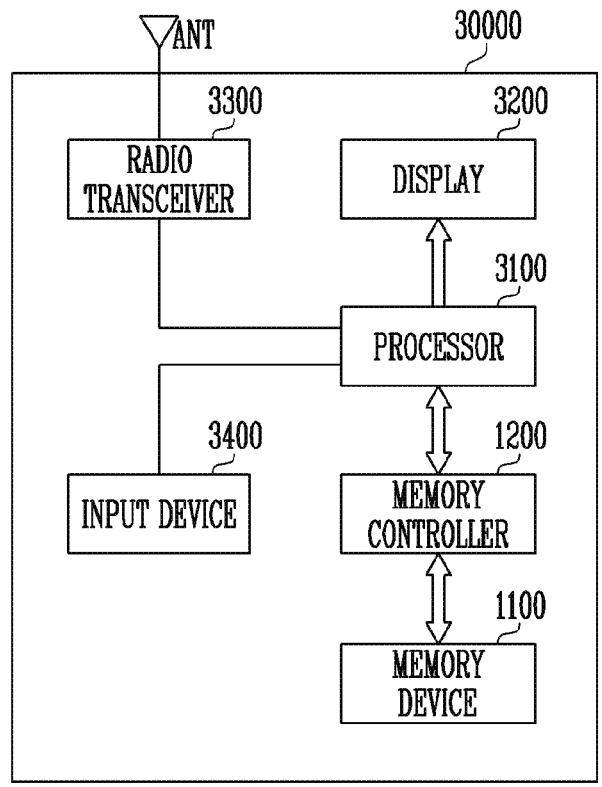
FIG. 8 is a diagram illustrating an embodiment of a memory system including the memory device shown in FIG. 2.

FIG. 8 is a diagram illustrating an embodiment of a memory system 30000 including the memory device shown in FIG. 2.

Referring to FIG. 8, the memory system 30000 may be embodied in a cellular phone, a smartphone, a tablet PC, a personal digital assistant (PDA) or a wireless communication device. The memory system 30000 may include a memory device 1100, and a memory controller 1200 configured to control the operation of the memory device 1100. The memory controller 1200 may control a data access operation, e.g., a program operation, an erase operation, or a read operation, of the memory device 1100 under control of a processor 3100.

Data programmed in the memory device 1100 may be outputted through a display 3200 under control of the memory controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the memory controller 1200, data outputted from the radio transceiver 3300, or data outputted form the input device 3400 is outputted through the display 3200.

In an embodiment, the memory controller 1200 capable of controlling the operation of the memory device 1100 may be embodied as a part of the processor 3100 or a chip provided separately from the processor 3100.

Figure 9:
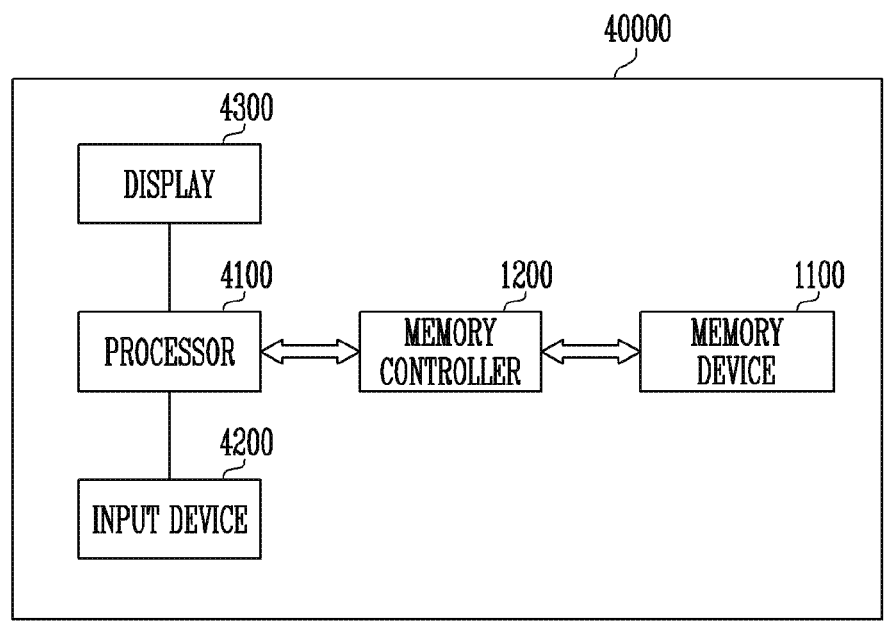
FIG. 9 is a diagram illustrating an embodiment of a memory system including the memory device shown in FIG. 2.

FIG. 9 is a diagram illustrating an embodiment of a memory system 40000 including the memory device shown in FIG. 2.

Referring to FIG. 9, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include the memory device 1100, and a memory controller 1200 configured to control the data processing operation of the memory device 1100.

A processor 4100 may output data stored in the memory device 1100 through a display 4300, according to data inputted from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100.

Figure 10:
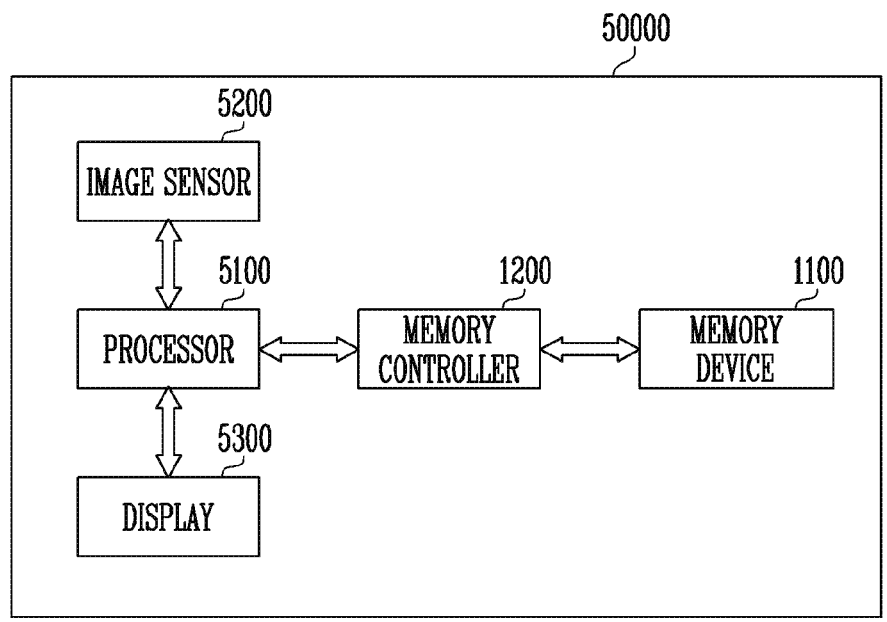
FIG. 10 is a diagram illustrating an embodiment of a memory system including the memory device shown in FIG. 2.

FIG. 10 is a diagram illustrating an embodiment of a memory system 50000 including the memory device shown in FIG. 2.

Referring to FIG. 10, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 1100, and a memory controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the memory device 1100 through the memory controller 1200. Data stored in the memory device 1100 may be outputted through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100.

Figure 11:
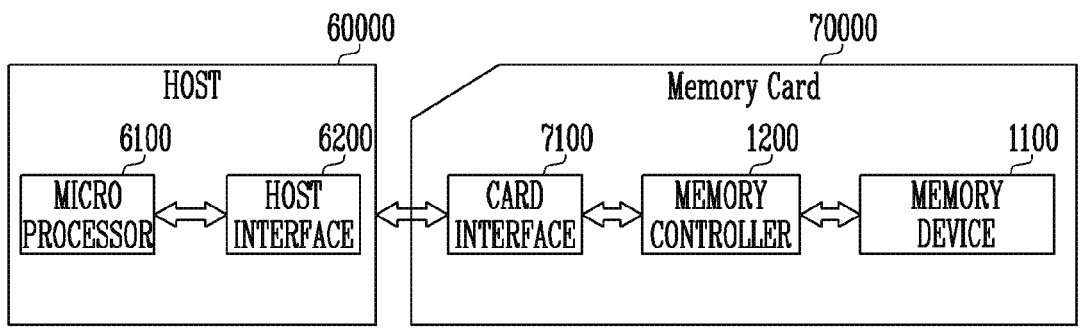
FIG. 11 is a diagram illustrating an embodiment of a memory system including the memory device shown in FIG. 2.

FIG. 11 is a diagram illustrating an embodiment of a memory system 70000 including the memory device shown in FIG. 2.

Referring to FIG. 11, the memory system 70000 may be embodied in a memory card or a smart card. The memory system 70000 may include a memory device 1100, a memory controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100.

In various embodiments of the present disclosure, during an erase operation of a memory device, a soft program operation is performed such that threshold voltages of some of a plurality of dummy memory cells are lower than threshold voltages of the other dummy memory cells, whereby electrical characteristics of the memory cells may be improved. Dummy memory cells having relatively low threshold voltages are used for data storage, so that the capacity of the memory device may be improved.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic concepts described herein will still fall within the spirit and scope of the present disclosure as defined in the appended claims and their equivalents.

What is claimed is:

1. A memory device comprising:
a memory block including a plurality of select transistors, a plurality of normal memory cells and a plurality of dummy memory cells disposed between the plurality of select transistors and the plurality of normal memory cells;

a peripheral circuit configured to perform an erase operation and a soft program operation on the memory block; and control logic configured to control the peripheral circuit to control the erase operation and the soft program operation, wherein during the soft program operation, threshold voltages of first dummy memory cells adjacent to the plurality of select transistors among the plurality of dummy memory cells are controlled to be higher than threshold voltages of second dummy memory cells adjacent to the plurality of normal memory cells among the plurality of dummy memory cells.

2. The memory device according to claim 1, wherein the control logic controls the peripheral circuit such that, during a first soft program operation of the soft program operation, threshold voltages of the plurality of dummy memory cells are higher than threshold voltages of the normal memory cells.

3. The memory device according to claim 2, wherein the control logic controls the peripheral circuit such that, during the first soft program operation, the threshold voltages of the plurality of dummy memory cells are programmed to be lower than 0 V.

4. The memory device according to claim 2, wherein the control logic controls the peripheral circuit such that, during a second soft program operation of the soft program operation, the threshold voltages of the first dummy memory cells are higher than the threshold voltages of the second dummy memory cells.

5. The memory device according to claim 1, wherein the control logic controls the peripheral circuit such that, during the soft program operation, threshold voltages of the plurality of dummy memory cells are higher than threshold voltages of the normal memory cells.

6. The memory device according to claim 5, wherein the control logic controls the peripheral circuit such that, after the threshold voltages of the plurality of dummy memory cells are higher than the threshold voltages of the normal memory cells, an additional program voltage is applied to the first dummy memory cells at least once.

7. The memory device according to claim 1,
wherein the plurality of select transistors include a source select transistor and a drain select transistor.

8. The memory device according to claim 7, wherein the first dummy memory cells include at least one source dummy memory cell adjacent to the source select transistor among a plurality of source dummy memory cells, and at least one drain dummy memory cell adjacent to the drain select transistor among a plurality of drain dummy memory cells.

9. The memory device according to claim 8, wherein the second dummy memory cells include dummy memory cells other than the first dummy memory cells among the plurality of dummy memory cells.

10. A method of operating a memory device, comprising:
performing an erase operation on a memory block;
performing a soft program operation on a plurality of dummy memory cells included in the memory block; and
applying, after the soft program operation is completed, an additional program voltage to first dummy memory cells of the dummy memory cells at least once.

11. The method according to claim 10,
wherein the memory block includes a source select transistor, a plurality of source dummy memory cells, a plurality of normal memory cells, a plurality of drain dummy memory cells, and a drain select transistor which are coupled in series between a source line and a bit line, and
wherein the plurality of dummy memory cells include the plurality of source dummy memory cells and the plurality of drain dummy memory cells.

12. The method according to claim 11, wherein the first dummy memory cells include at least one source dummy memory cell adjacent to the source select transistor among the plurality of source dummy memory cells, and at least one drain dummy memory cell adjacent to the drain select transistor among the plurality of drain dummy memory cells.

13. The method according to claim 11, wherein the soft program operation is performed such that threshold voltages of the plurality of dummy memory cells are higher than threshold voltages of the plurality of normal memory cells.

14. The method according to claim 11,
wherein the applying of the additional program voltage is performed such that threshold voltages of the first dummy memory cells are higher than threshold voltages of a second dummy memory cells, and
wherein the second dummy memory cells include dummy memory cells other than the first dummy memory cells among the plurality of dummy memory cells.

15. A method of operating a memory device, comprising:
performing an erase operation on a memory block including a plurality of normal memory cells and a plurality of dummy memory cells;
performing a first soft program operation on the plurality of dummy memory cells; and
performing a second soft program operation on first dummy memory cells of the plurality of dummy memory cells.

16. The method according to claim 15,
wherein the memory block includes a source select transistor, a plurality of source dummy memory cells, the plurality of normal memory cells, a plurality of drain dummy memory cells, and a drain select transistor which are coupled in series between a source line and a bit line, and
wherein the plurality of dummy memory cells include the plurality of source dummy memory cells and the plurality of drain dummy memory cells.

17. The method according to claim 16, wherein the first dummy memory cells include at least one source dummy memory cell adjacent to the source select transistor among the plurality of source dummy memory cells, and at least one drain dummy memory cell adjacent to the drain select transistor among the plurality of drain dummy memory cells.

18. The method according to claim 15, wherein the first soft program operation is performed such that threshold voltages of the plurality of dummy memory cells are higher than threshold voltages of the plurality of normal memory cells.

19. The method according to claim 15,
wherein the second soft program operation is performed such that threshold voltages of the first dummy memory cells are higher than threshold voltages of second dummy memory cells, and
wherein the second dummy memory cells include dummy memory cells other than the first dummy memory cells among the plurality of dummy memory cells.

20. The method according to claim 19, wherein after the second soft program operation is completed, the second dummy memory cells have threshold voltages lower than 0 V.

* * * * *